United States Patent

Krynicki

[11] Patent Number: 4,571,574
[45] Date of Patent: Feb. 18, 1986

[54] ANALOGUE TO DIGITAL CONVERTER

[76] Inventor: Witold Krynicki, 321 W. Le Roy Ave., Arcadia, Calif. 91006

[21] Appl. No.: 429,846

[22] Filed: Sep. 30, 1982

[51] Int. Cl.[4] .......................................... H03K 13/175
[52] U.S. Cl. ...................... 340/347 AD; 340/347 DA
[58] Field of Search ................ 340/347 AD, 347 DD, 340/347 M, 347 DA

[56] References Cited

U.S. PATENT DOCUMENTS

| | | | |
|---|---|---|---|
| 3,585,631 | 6/1971 | McCown | 340/347 AD |
| 3,932,865 | 1/1976 | Sagara et al. | 340/347 AD |
| 4,099,173 | 6/1978 | Zeskind et al. | 340/347 AD |
| 4,110,745 | 8/1978 | Ninomiya | 340/347 AD |
| 4,417,233 | 11/1983 | Inoue et al. | 340/347 M |

OTHER PUBLICATIONS

The Engineering Staff of the Digital Equipment Corp., Analog–Digital Conversion Handbook, 1964, pp. 20–21.

Digital Design, "New Designs Improve Performance of Flash Aids", Feb. 1985, p. 38.

Primary Examiner—Errol A. Krass
Assistant Examiner—Heather R. Herndon

[57] ABSTRACT

An analogue to digital converter using several flash converter units to convert successively the increasingly lower orders of resolution, wherein the transition from a stage of lower magnitude of resolution to that stage of successively higher magnitude of resolution is obtained by physically isolating the resistor element of the resistor ladder of the first flash converter wherein the unresolved portion of the input voltage falls, and substituting a second flash converter comprising a resistor ladder of same total resistance as the resistor element it replaces but of higher resolution by one order of magnitude; then repeating the same with each successive flash converter.

2 Claims, 2 Drawing Figures

ANALOGUE TO DIGITAL CONVERTER

BACKGROUND OF THE INVENTION

The present invention pertains to analogue-to-digital converters in general and in particular to the high speed high resolution converter types.

There are many AD converters, however the two most popular at the present time are: the successive approximation type, and variations thereof; and the parallel or flash converter type, and a variation thereof, the half-flash converter, which combines both successive approximation and flash methods.

In a successive approximation converter a voltage is generated from zero to maximum, by an internal digital-to-analogue converter and each successive increment compared with the converter input voltage until a match is reached, the setting of the DA converter then represents the value of the input voltage.

A flash converter consists essentially of a voltage divider resistor ladder with fixed tap positions defining resistor segments corresponding to the desired resolution of the converter. Accordingly a converter of "n" bit resolution would require $2^{n+1}$ resistor segments. Each tap is connected to a comparator of its own, and accordingly $2^{n-1}$ comparators are needed. Each comparator compares its voltage divider voltage with the converter's input voltage. The line of comparators respond according to a "thermometer code", those comparators with thresholds below the converter input voltage, turn on, while those with thresholds above the input voltage remain off. The output of all the comparators is then translated by an encoder into a binary or decimal number.

In a half-flash converter, the output of a first flash-converter of low resolution is used to generate a voltage by means of an internal digital-to-analogue converter, this voltage is then subtracted from the input voltage to provide a new voltage representing the lower resolution portion of the input voltage, which is then fed into a second flash-converter unit and both results combined by appropriate encoder units. Here speed is sacrificed for reduction in total number of comparators, however the total circuit is no longer monotonic.

It can be seen that typically a successive approximation method is very slow as it does require $2^{n-1}$ successive operations, and a flash-converter is complex as it requires $2^{n-1}$ comparators. In way of example, an 8 bit converter would require 255 comparators, while a 9 bit converter requires 511 comparators, since it increases geometrically.

SUMMARY OF THE INVENTION

It is therefore the object of this invention to provide an economical high speed, high resolution analogue-to-digital converter.

In the present invention two or several flash converters are used: one for the low resolution component of the input voltage; a medium resolution flash converter; high resolution converter; and higher and higher resolution with each additional flash converter unit. The configuration and interconnection of these converters is novel, and the principle of operation is as follows: in a flash converter the resistor segment between the comparator that has turned on and the next comparator that has remained off, is the unresolved portion of the input voltage, and defines the resolving power of the converter. This resistor element is heretofore called the "resistor element of least significant definition". In the present invention, switching means are provided to disconnect said resistor segment and substitute in its place the second flash converter, whose resistor ladder has a total resistance equal to the resistor segment it replaces, to resolve that previously unresolved segment. Meanwhile the first flash-converter output is encoded. The same procedure is repeated on the third and any number of successive flash converters necessary to obtain any degree of resolution desired.

DETAILED DESCRIPTION OF THE EMBODIMENTS

Figure 1:
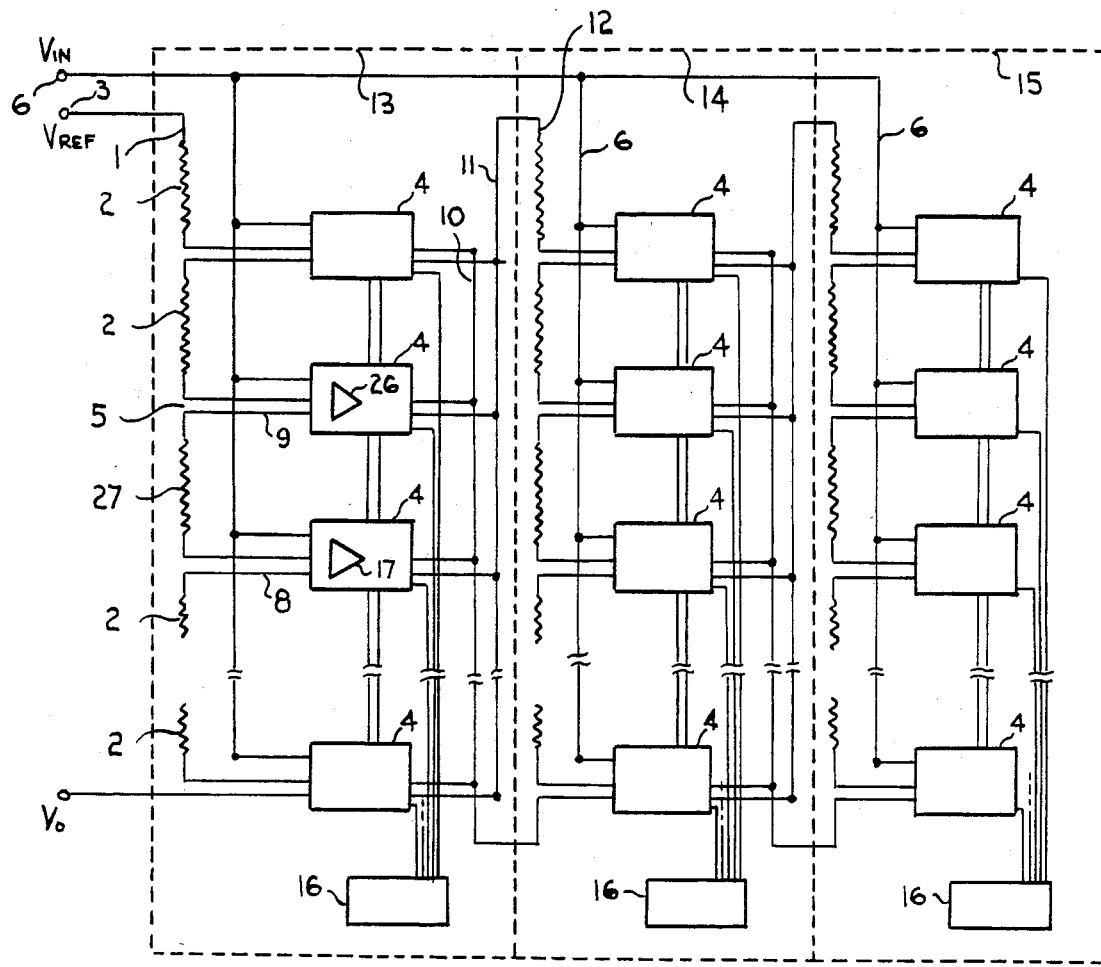
FIG. 1 is a block diagram of the essential functional components of the invention

FIG. 1 is a block circuit diagram of the essential components of the instant novel converter and comprises: a voltage divider ladder network 1, with unit resistors 2; reference voltage 3, applied across said voltage divider; one comparator-switch circuit 4 for each resistor-resistor junction 5; resistor-resistor taps 8 and 9 form two consecutive resistor-resistor junctions; buss lines 10 and 11, interconnecting said resistor-resistor junction leads 8 and 9 with the second voltage divider ladder network 12; a second flash converter unit 14, identical to the first flash converter unit 13, except that the total resistance of the resistor ladder is electrically identical with the value of the single unit resistor 2, but physically longer to provide higher accuracies, as the unit resistances of of successive flash-converters become smaller; additional one or more flash converters 15; and encoding devices 16, associated with each flash converter.

Figure 2:
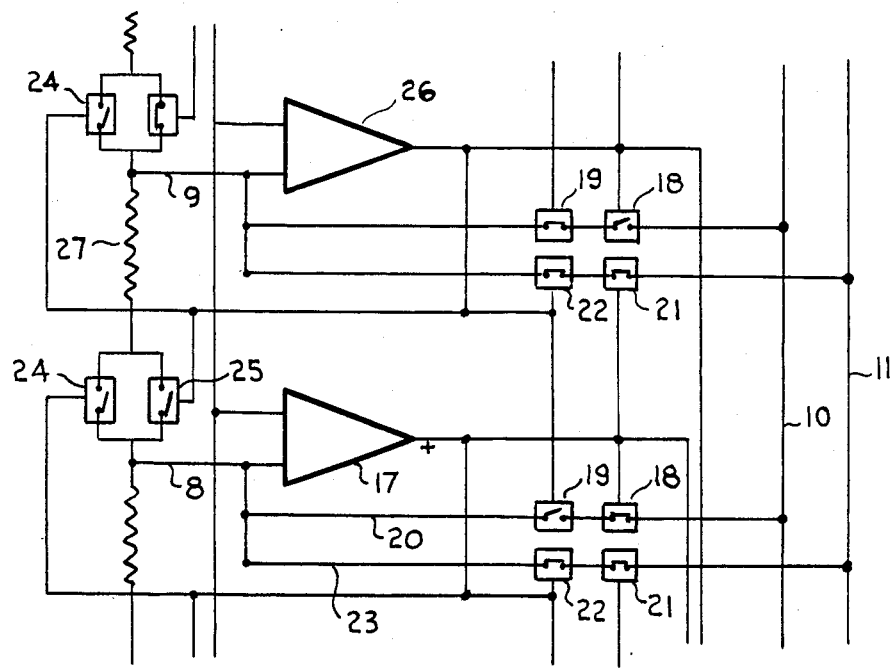
FIG. 2 is a detailed diagram of the comparator switch circuit.

FIG. 2 shows, in detail, the comparator-switch circuit 4, associated with each resistor-resistor junction, and consists of: a comparator 17; switches 18 and 19, in series on one branch 20 of the interconnecting line between resistor-resistor junction at the lower end of a unit resistor and buss line 10; switches 21 and 22, in series on one branch 23 of the interconnecting line between the adjoining resistor-resistor junction of higher voltage and buss line 11; switches 24 and 25, in parallel with respect to each other but in series with the resistors. Switches 18, 21 and 24 are positively biased and respond to comparator 17, while switches 19, 22 and 25 are negatively biased and respond to comparator 26 of the next resistor-resistor junction.

MODE OF OPERATION OF THE INVENTION

It can clearly be seen that the only time that both sets of switches 18–19 and 21–22 are closed at the same time, and that the only time that the set of switches 24–25 is open at the same time, is when one of the two comparators controling them is on while the other one is off. This can only happen at the threshold point, since all the comparators at and below the threshold are on, and all of the comparators above the threshold are off. Assuming that 17 and 26, FIG. 1 and 2, are those comparators respectively, than resistor element 27 is the only resistor element that can be and is substituted with the second flash-converter 14. As soon as the substitution is completed, the threshold level in converter 14 is reached and converter 15 is substituted o for the threshold resistor element in converter 14, and so on with any additional converters.

What I claim is:

1. An analogue to digital converter comprising:

a reference voltage divider with a plurality of fixed unit resistor elements, disposed as a resistor ladder network, a comparator at each resistor-resistor junction of said resistor elements on said voltage divider, one terminal of said comparator being connected to each of said resistor-resistor junctions, a reference voltage across the voltage divider, generating equal voltage increments in said voltage divider and causing said comparators to be biased to corresponding voltage increments, an input voltage connected to a second terminal of all said comparators, and causing all comparators that are below the reference voltage-divider threshold to turn on, while all comparators above the threshold remain off, switching means connected between said resistors and said resistor-resistor junction and operable to disconnect said resistor element located between said comparator just below the reference voltage threshold and said comparator at just above the reference voltage threshold, a second voltage divider comprising a resistor-ladder of total resistance value equal to the resistance of one said unit resistor element of said first reference voltage divider, and also comprising a plurality of fixed unit resistor elements of higher resolution, and comparators at each resistor-resistor junction thereof, said reference voltage then being subdivided in said second voltage divider, into incremental voltages and in the corresponding comparators into incremental thresholds, causing those comparators that are at a freshold below the reference voltage to turn on, while all the comparators above the threshold will remain off, switching means to connect the resistor-resistor junction of the first of said comparators that have turned on, and the resistor-resistor junction of the first of said comparators that have remained off, across the resistor-ladder of said second voltage divider, encoder means coupled to said comparators of the first voltage divider to encode the outputs of the comparators of said first voltage divider, and second encoder means coupled to said comparators of said second voltage divider to encode the comparator outputs of said second voltage divider.

2. An analogue-to-digital converter as claimed in claim 1, comprising a plurality of said voltage-divider-comparator units, each successive voltage divider resistor ladder having a total resistance value equal to the unit resistor element of the preceeding voltage divider and of higher resolution.

* * * * *